US012785687B1

(12) United States Patent
Joshua et al.

(10) Patent No.: US 12,785,687 B1
(45) Date of Patent: Nov. 3, 2026

(54) CURRENT MIRROR LATCH LEVEL SHIFTER LOW VDD SCALING

(71) Applicant: Sandisk Technologies, Inc., Milpitas, CA (US)

(72) Inventors: Alvin Joshua, Fujisawa (JP); Yuki Kuniyoshi, Fujisawa (JP); Hardwell Chibvongodze, Hiratsuka (JP)

(73) Assignee: Sandisk Technologies, Inc., Milpitas, CA (US)

(*) Notice: Subject to any disclaimer, the term of this patent is extended or adjusted under 35 U.S.C. 154(b) by 0 days.

(21) Appl. No.: 19/234,171

(22) Filed: Jun. 10, 2025

(51) Int. Cl.
*H03K 19/00* (2006.01)
*H03K 19/0185* (2006.01)

(52) U.S. Cl.
CPC .................. *H03K 19/0013* (2013.01); *H03K 19/018521* (2013.01)

(58) Field of Classification Search
CPC .......... H03K 19/0008; H03K 19/0013; H03K 19/0175; H03K 19/0185; H03K 19/018507; H03K 19/018521
See application file for complete search history.

(56) References Cited

U.S. PATENT DOCUMENTS 7,795,946 B2 * 9/2010 Kim ................ H03K 3/356113 327/333
8,638,618 B2 1/2014 Hung et al.
8,653,877 B2 2/2014 Wu et al.
9,438,240 B1 * 9/2016 Gradinariu ............ G11C 16/06
9,866,216 B1 * 1/2018 Gradinariu ............ G11C 16/06
10,305,482 B2 * 5/2019 Chen .................... H02M 3/155
11,050,424 B1 6/2021 Nagarajan et al.
2007/0188194 A1 * 8/2007 Yang ............. H03K 19/018528 326/80
2007/0268230 A1 * 11/2007 Park .................... G09G 3/3611 345/100
2021/0409010 A1 * 12/2021 Javvaji .......... H03K 19/018521
2023/0291394 A1 * 9/2023 Ding ..................... H03K 3/037
(Continued)

FOREIGN PATENT DOCUMENTS

CN 112187253 A 1/2021
CN 115708319 A 2/2023

OTHER PUBLICATIONS

Wang, Chao, et al., "An Ultra-Low-Voltage Level Shifter With Embedded Re-Configurable Logic and Time-Borrowing Latch Technique," IEEE Access, Jun. 8, 2021, 7 pages.
(Continued)

*Primary Examiner* — Jason M Crawford
(74) *Attorney, Agent, or Firm* — Pearl Cohen LLP

(57) ABSTRACT

On memory die and other circuits, some parts may operate at a VDD logic level while other elements operate at a higher logic level, such as at or near the die's supply level VSUP. To reduce power consumption and increase operating speeds, VDD levels are moving to increasingly lower voltages. To raise the logic signal from the lower level to the higher, level shifters can be used. However, as the gap between the supply level VSUP and VDD widens, it can become difficult for a level shifter to reliably raise a logic signal operating at the VDD level to the VSUP level. To address this problem, current mirrors are used to drive the NMOSs of the legs of the level shifter's leg's NMOS, providing robust operation even at low VDD levels.

20 Claims, 14 Drawing Sheets

(56) References Cited

U.S. PATENT DOCUMENTS

| | | | | |
|---|---|---|---|---|
| 2024/0223190 | A1* | 7/2024 | Lam | H03K 19/00315 |
| 2024/0364338 | A1* | 10/2024 | Joshua | H03K 3/356113 |

OTHER PUBLICATIONS

Ebrahimi, Elnaz, et al., "Level Shifter Design for Voltage Stacking," 2017 IEEE International Symposium on Circuits and Systems (ISCAS), Sep. 2017, 4 pages.

Zhou, Jun, et al., "An Ultra-Low Voltage Level Shifter Using Revised Wilson Current Mirror for Fast and Energy-Efficient Wide-Range Voltage Conversion from Sub-threshold to I/O Voltage," Abstract only, IEEE Transactions on Circuits and Systems I: Regular Papers, vol. 62, Issue: 3, Mar. 2015.

* cited by examiner

CURRENT MIRROR LATCH LEVEL SHIFTER LOW VDD SCALING

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed, but also to use lower power.

BRIEF DESCRIPTION OF THE DRAWINGS

Like-numbered elements refer to common components in the different figures.

DETAILED DESCRIPTION

In many devices, such as a memory die, different parts of the circuitry operate at different logic levels. For example, the state machine and other system control logic of a memory die may operate at a VDD logic level while other elements, such as decoding circuitry for the memory array, may operate at a higher logic level, such as at or near the die's supply level VSUP. To reduce power consumption and increase operating speeds, VDD levels are moving to increasingly lower voltages. To raise the logic signal from the lower level to the higher, level shifters can be used. However, as the gap between the supply level VSUP and VDD widens, it can become difficult for a level shifter to reliably raise a logic signal operating at the VDD level to the VSUP level.

To address this problem, rather than apply the VDD level input signal and its inverse directly to the legs of the level shifter circuit, these input signals are used to control switches that apply current sources to the NMOS transistors of the legs of the level shifter. The current sources can be based on a current mirror structure. This arrangement can provide robust operation of the level shifter even at low VDD levels.

FIGS. 1A-6 describe one example of a storage system that can be used to implement the technology disclosed herein.

Figure 1A:
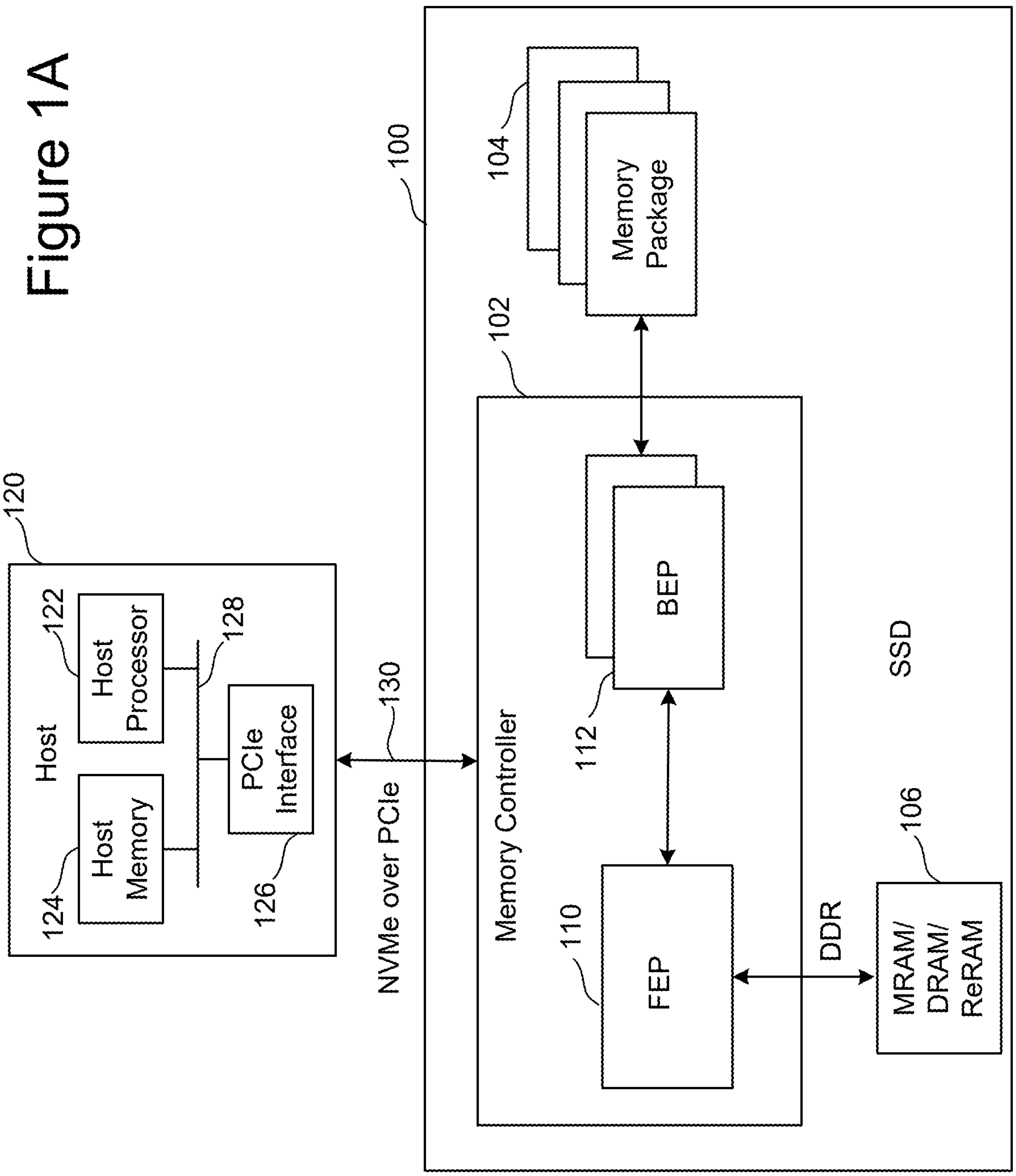
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master, and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host system 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
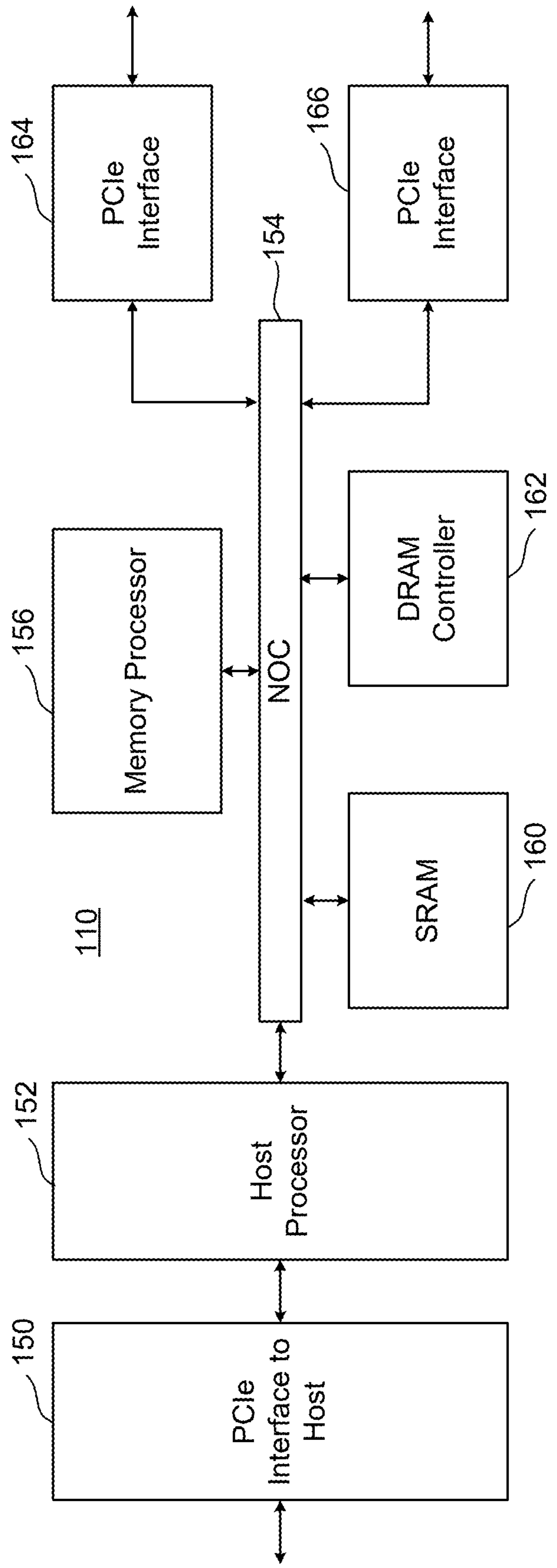
FIG. 1B is a block diagram of one embodiment of a Front End Processor
Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
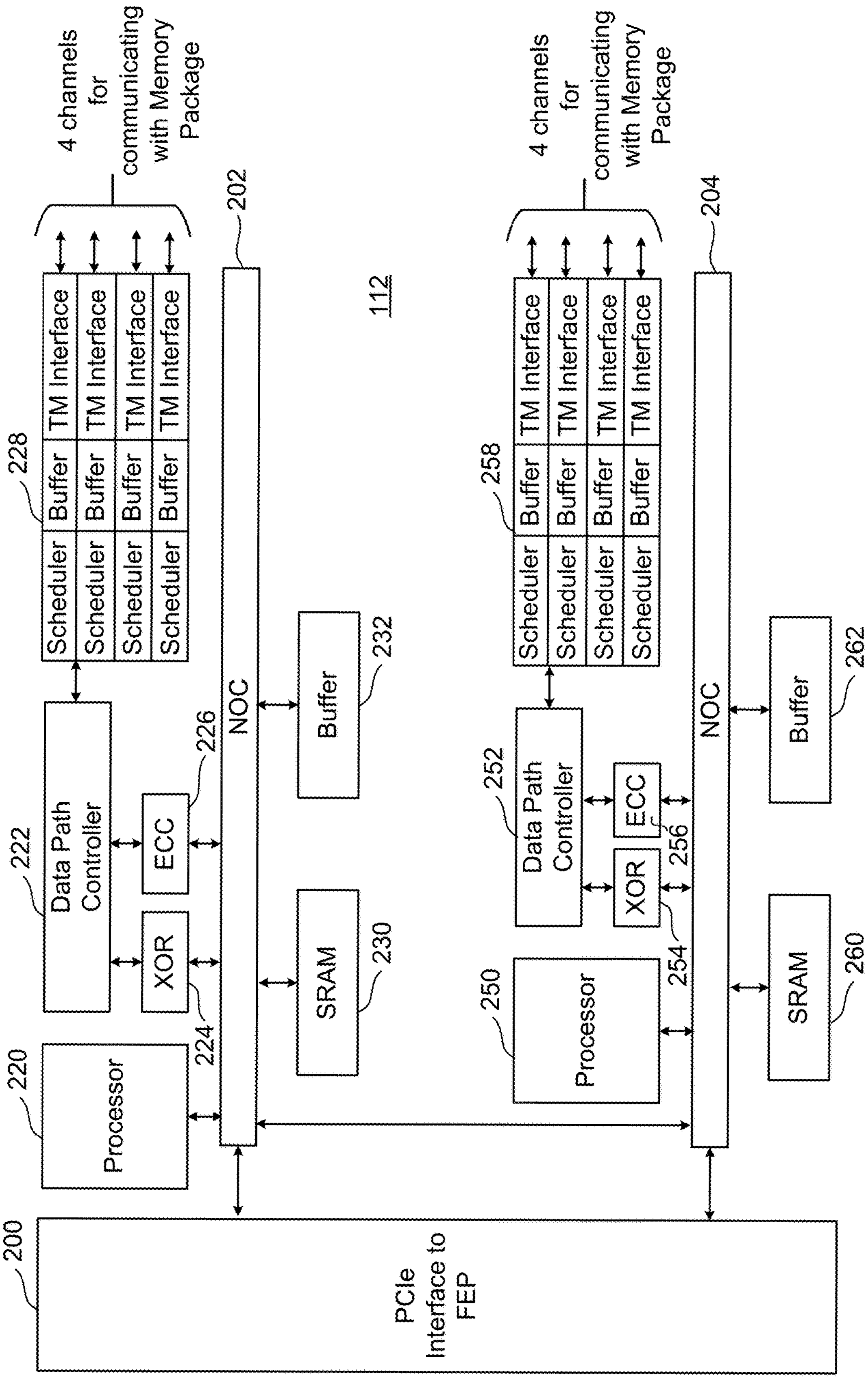
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
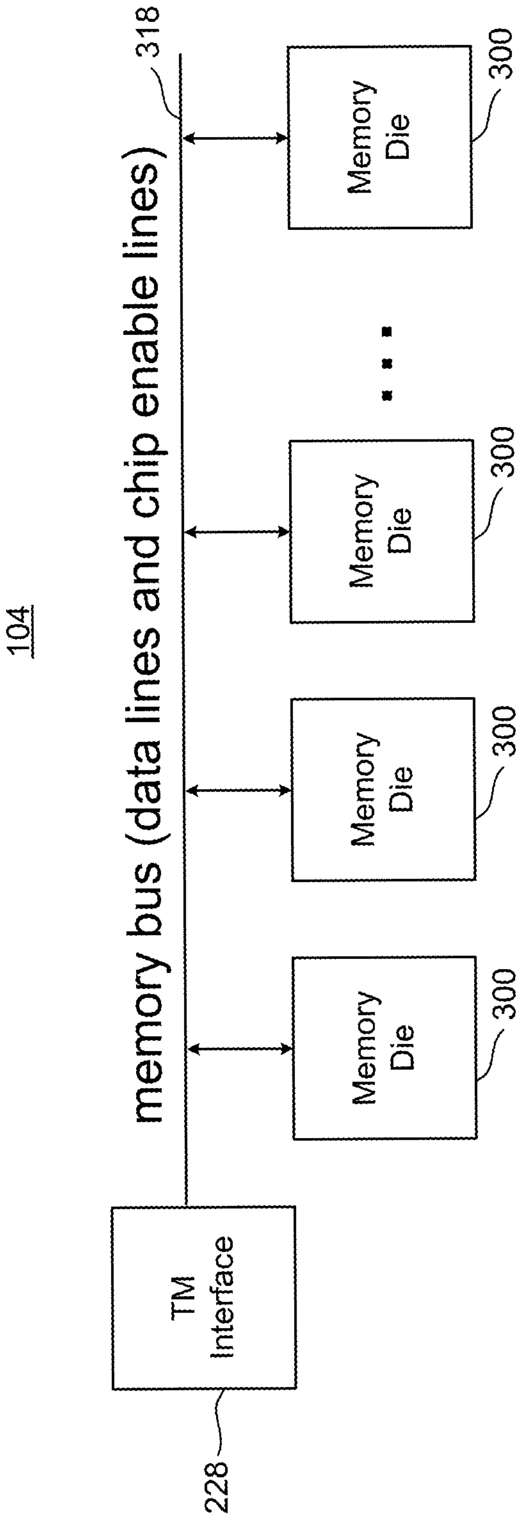
FIG. 2B is a block diagram of one embodiment of a memory package.

FIG. 2B is a block diagram of one embodiment of a memory package 104 that includes a plurality of memory dies 300 connected to a bus (data lines and chip enable lines) 318. The data bus 318 (memory bus) connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
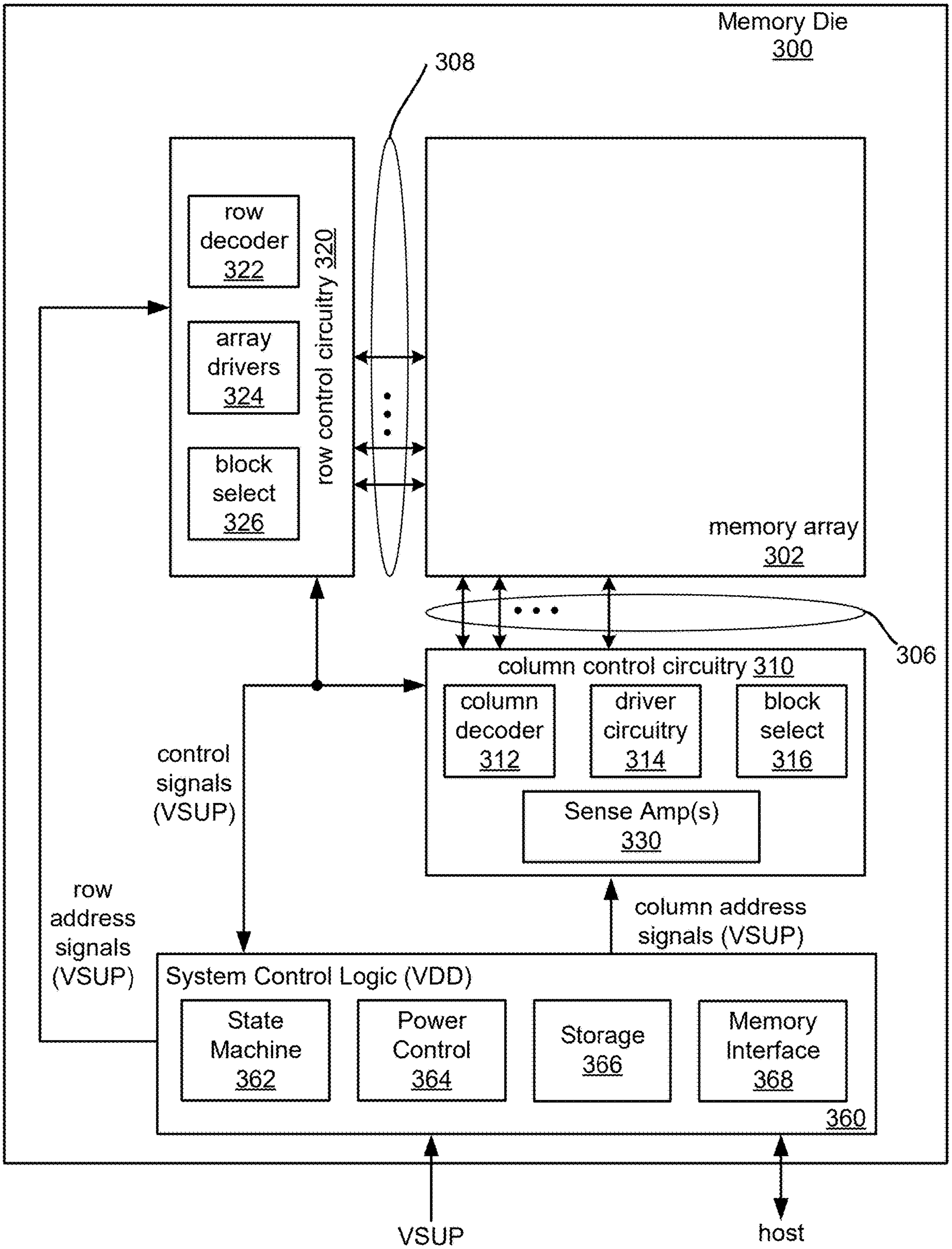
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs are connected to respective word lines of the memory array 302 via electrical paths 308. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs are connected to respective bit lines of the memory array 302. Although only single block is shown for memory structure 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

One input to the memory die 300 or controller die 311 is a supply voltage VSUP, which is represented separately as it will be discussed below. The power control module 364 can then generate the various voltage levels used on the die. The system control logic 360, for example, will operate at a high logic level VDD, as noted parenthetically in system control logic 360. To reduce power consumption, the VDD voltage level will often be quite a lower than the received supply voltage level VSUP, being stepped down to a regulated level by a voltage regulator in the power control module 364. As technology progresses, the voltage level used for VDD continues to decrease. The column control 310 and row control circuitry 320 will often operate at a high voltage level than VDD, such as VSUP as indicated parenthetically for the control and address signals between these elements and the system control logic 360. (Although the control and address signals are here shown as operating at VSUP to simplify the discussion, more generally this can be another level than the VSUP received by the memory die 300 or controller die 311, although still higher VDD.) Consequently, to raise these control and address signals from VDD to the higher level, the power control module 364 or other element in the system control logic can use a level shifter, as is discussed in more detail below.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "control circuit(s)" can include a controller, a state machine, a micro-controller, micro-processor, and/or other control circuitry as represented by the system control logic 360, column control circuitry 310 or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the newly claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits and latches within the available area can be a significant restriction on sense amplifier and latch design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders, latches, and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
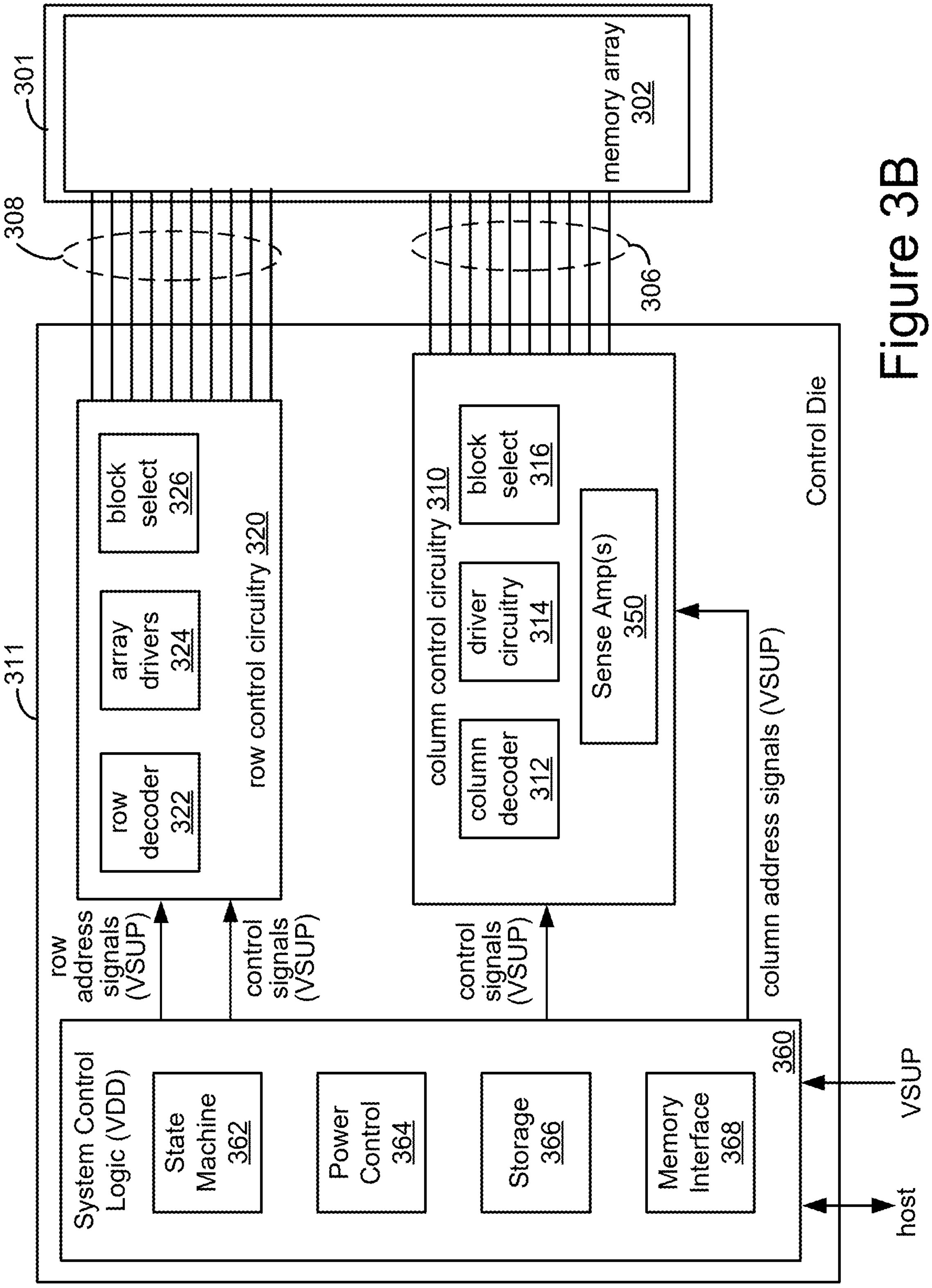
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver 314, and block select circuitry 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select circuitry 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "control circuit(s)" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

As discussed above with respect to FIGS. 3A and 3B, the system control logic 360 will often operate at one value for the high logic level of VDD, while the column control circuitry 310 and row control circuitry 320 will operate at a different, higher voltage logic level, referred to in the following discussion as VSUP, which may be the same or different than the supply level received by the memory die 300 or controller die 311. To raise the high logic level from VDD to VSUP, a level shifter circuit can be used.

Figure 4:
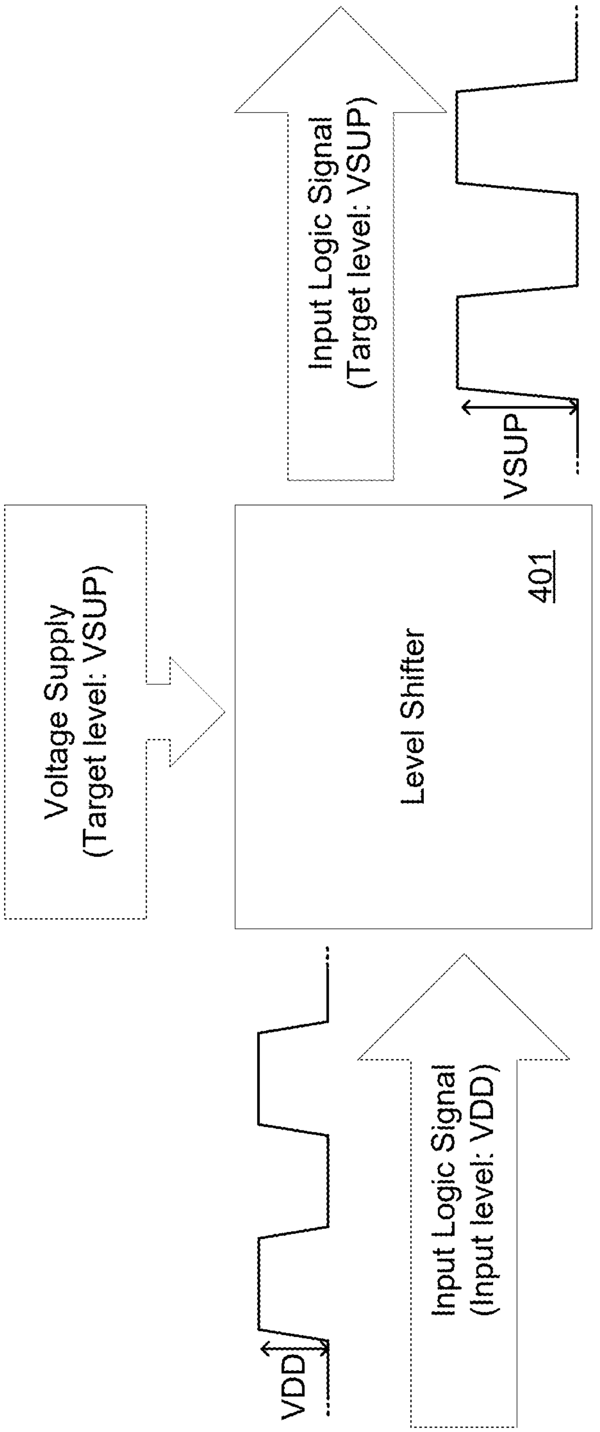
FIG. 4 is a schematic representation of a level shifter's function.

FIG. 4 is a schematic representation of an example of a level shifter's function. In this example, the level shifter 401 is connected to receive the voltage supply level of VSUP as received by the memory die 300 or control die 311, which is used shift the range of the input logic signal. Here the input logic signal has a high level of VDD, which is the level used by the system control logic 360 and for input/output signals to memory controller 102. The target level for the logic signals at the output is here VSUP as used as the high logic input level by elements of the memory die 300 or control die 311 such as charge pumps, the row control circuitry 320, and column control circuitry 310. An example input logic signal of alternating high and low values of amplitude VDD and the result shifted signal of amplitude VSUP are shown. Although the target logic level at the output of the level shifter 401 is the same as the voltage supply level of VSUP, other embodiments may use a value below VSUP but still above VDD.

Figure 5A:
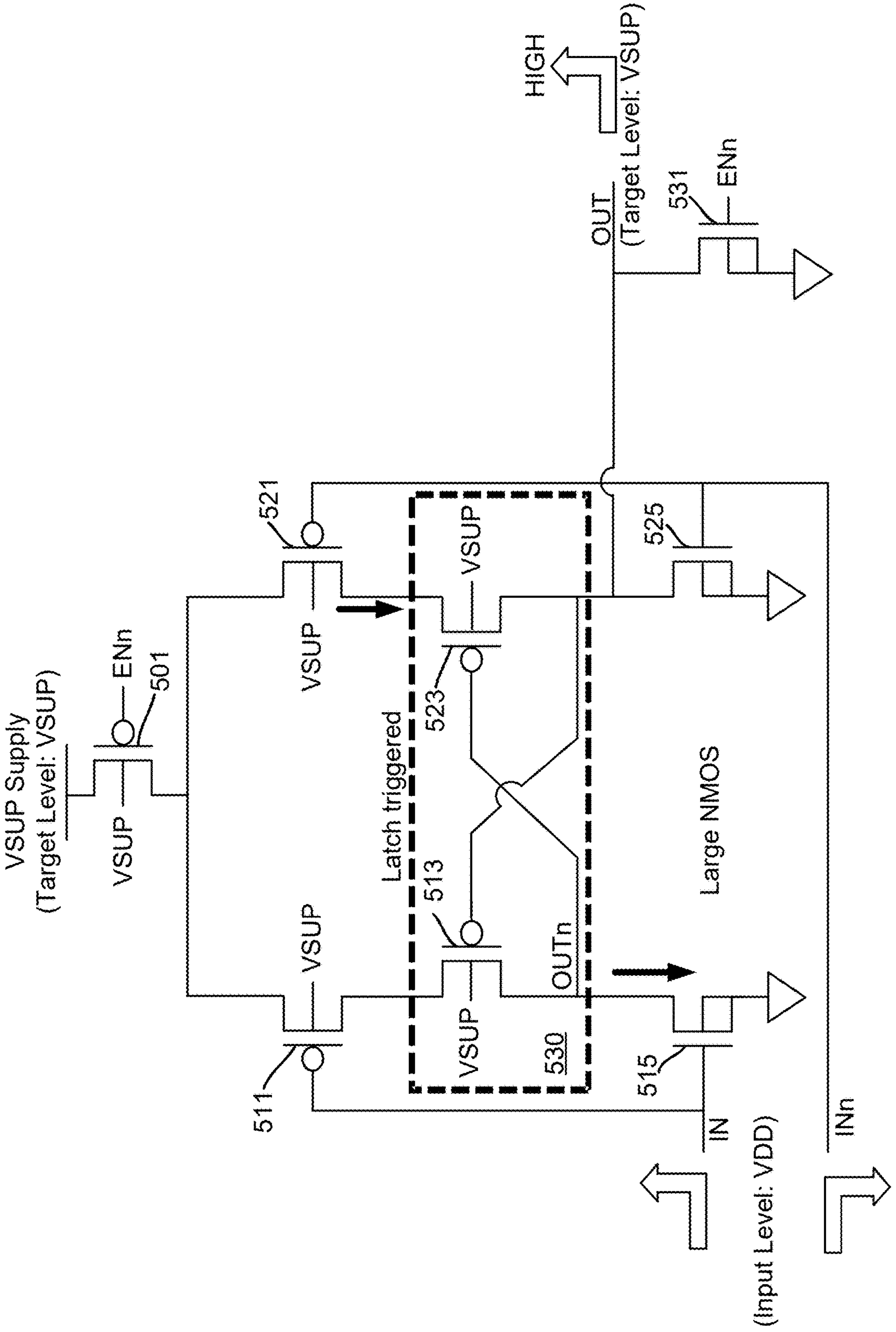
FIG. 5A illustrates an embodiment of level shifter circuit block and its expected operation.

FIG. 5A illustrates an embodiment of a level shifter circuit block and its expected operation. As arranged in FIG. 5A, the level shifter receives the supply voltage level of VSUP at top, the input signal IN and its inverse INn are received from the left, and the generated output signal OUT is provided at right. The level shifter is connected to the supply level through a PMOS 501 connected to receive the inverse of a level shifter enable signal (ENn) at its control gate, and the output is connected to ground by an NMOS 531 also connected to receive ENn. When the level shifter is disabled, ENn is high, so that 531 is on and the output OUT is low and 501 is off and the level shifter is cutoff from the voltage supply. When the level shifter is enabled. ENn is low so that 531 is off and 501 is on. The following will consider the situation when the level shifter is enabled and some of the subsequent figures will omit the NMOS 531 and the PMOS 501.

The level shifter of FIG. 5A includes a left leg of a current limiter PMOS 511 and NMOS 515 connected in series, in that order, in series between the supply level and ground and both having their control gates both connected to receive the input signal IN that has a high level of VDD. Consequently, when IN is low PMOS 511 is expected to be on and NMOS 515 is expected to be off; and when IN is high PMOS 511 is expected to be off and NMOS 515 is expected to be on. The right leg of the level shifter of FIG. 5A includes a PMOS 521 and NMOS 525 connected in series, in that order, in series between the supply level and ground and both having their control gates both connected to receive the inverse of the input signal INn. Consequently, when IN is low, INn is high and PMOS 511 is expected to be on and NMOS 515 is expected to be off; and when IN is high, INn is low and PMOS 511 is expected to be off and NMOS 515 is expected to be on.

To improve the robust logical operation of the level shifter, a latch structure 530 is connected between the upper PMOS and lower NMOS of each leg of the level shifter. In the left leg, current limiter PMOS 513 is connected in series with and between PMOS 511 and NMOS 515; and in the right leg PMOS 523 is connected in series with and between PMOS 521 and NMOS 525. The transistors of latch 530 are cross-coupled, with the gate of PMOS 513 connected between PMOS 523 and NMOS 525 and the gate of PMOS 523 connected between PMOS 513 and NMOS 515. The output OUT is then taken from a node between PMOS 523 and NMOS 525.

FIG. 5A considers the situation when IN changes from a low value (VSS or ground) to a high value (VDD). Considering from when IN is initially low, INn is high, so that PMOS 521 is off and NMOS 525 is on, so that the gate of latch PMOS 513 is set to ground and on. As IN is low, PMOS 511 is on, NMOS 515 is off, and the gate voltage OUTn-pr of latch PMOS 523 is set to high. Consequently, when IN is low, the OUT value will be a low value set in latch 530.

When IN subsequently goes high, PMOS 511 shuts off, NMOS 515 turns on to drain current as illustrated by the arrow, and the voltage OUTn on the gate of PMOS 523 is pulled low and 523 turns on. As INn goes low, PMOS 521 turns on and conducts as illustrated by the arrow, NMOS 525 is off, and the gate on PMOS 513 is high. Consequently, the latch 530 is triggered and the voltage on the output OUT will go to VSUP.

Figure 5B:
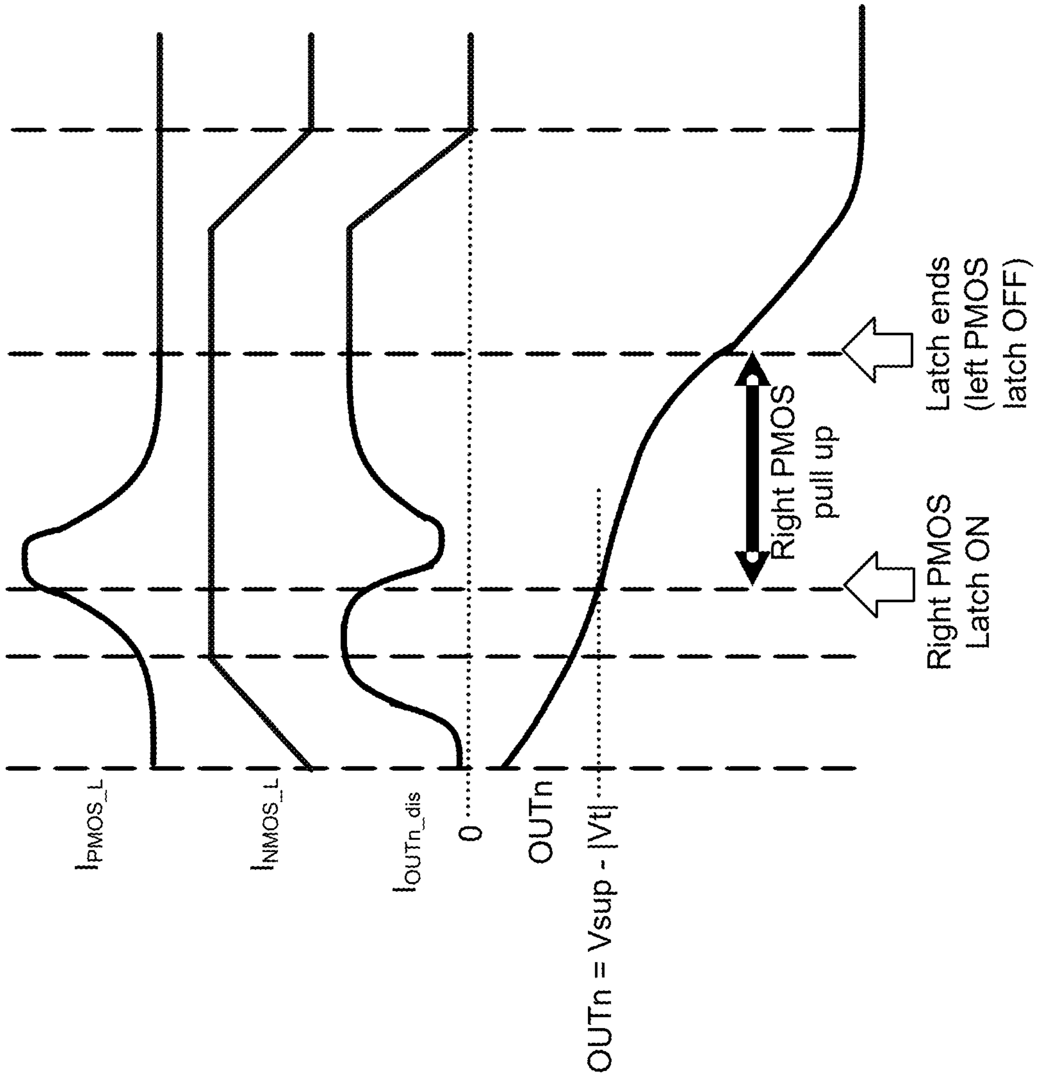
FIG. 5B is a set of waveforms for the left leg of the left leg of the level shifter of FIG. 5A when the input in IN goes from low to high.

FIG. 5B is a set of waveforms illustrating this operation for the left leg of the level shifter of FIG. 5A when the input in IN goes from low to high. At top is the current $I_{PMOPS\_L}$ through PMOS 513, next $I_{NMOPS\_L}$ is the current through NMOS 515, and then $I_{POUTn\_dis}$ is the current discharging the OUTn node. At bottom of FIG. 5B is the voltage level on the inverse output node OUTn. Initially, IN=0V and INn=VDD so that OUTn is at VSUP and OUT at 0V, with NMOS 515 off and PMOSs 511 and 513 on for the left leg and NMOS 525 on and PMOSs 521 and 523 on for the right leg. At this point, all three shown currents for the left leg are zero and OUTn=VSUP.

When IN goes from 0 to VDD, NMOS 515 begins turning on and the current $I_{NMOPS\_L}$ ramps up to its full on current, with next $I_{OUTn\_dis}$ also ramping up and discharging OUTn. As $I_{NMOPS\_L}$ reaches it maximum level, $I_{PMOPS\_L}$ begins to ramp up and $I_{OUTn\_dis}$ levels off and begin to roll off, while OUTn decreases and eventually hits OUTn=Vsup−|Vt|, where Vt is the threshold voltage of the latch's PMOSs, at which point right PMOS 523 turns on to charge up the OUT node. At this point, $I_{NMOPS\_L}$ rolls off and PMOS 513 turns off, $I_{OUTn\_dis}$ dips somewhat and then continues to discharge until OUTn goes to ground, when all of the currents drop to zero. This results in OUT going high to the VSUP target level.

For both power reduction and faster operating speeds, the trend has been toward lower VDD logic levels. This can result in a VSUP voltage level that is relatively high compared to VDD. As described with respect to FIGS. 5A and 5B, for the level shifter to function properly when IN is at its high level of VDD, PMOS 511 needs to be off. However, if the difference (VSUP−VDD) is too large, a large current may still flow through PMOS 511 even when IN is high and the latch 530 may fail to flip. This can be illustrated with respect to FIG. 6A.

Figure 6A:
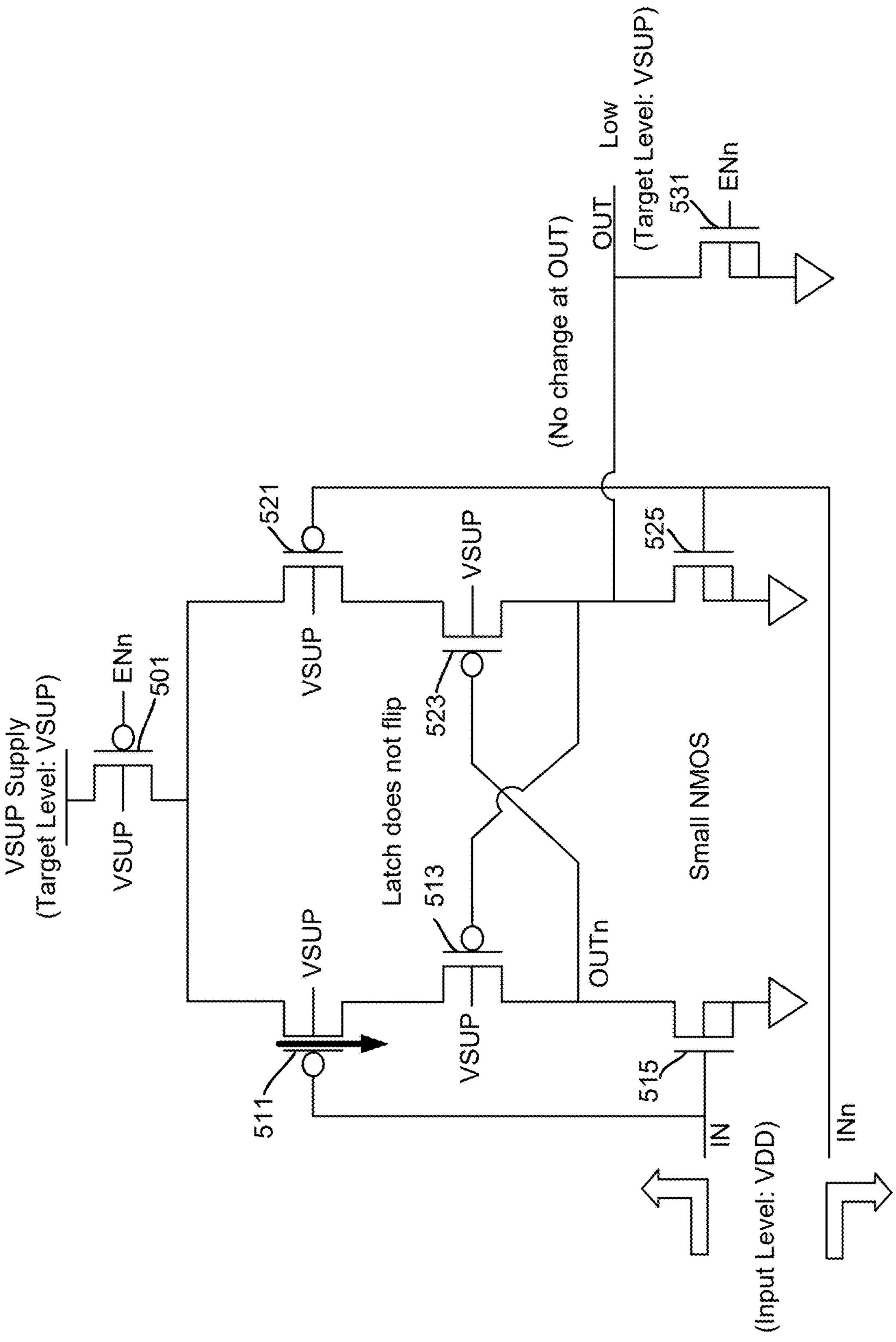
FIG. 6A illustrates the situation when the level shifter circuit block of FIG. 5A is operated with too low an input level relative to its supply level.

FIG. 6A illustrates the situation when the level shifter circuit block of FIG. 5A is operated with too low a relative input level. FIG. 6A repeats the elements of FIG. 5A (although the latch structure 530 of cross-coupled PMOSs 513, 523 is not boxed and numbered), but is marked for the situation when (VSUP−VDD) is large with respect to the Vth of the transistors. Considering when IN switches from low (VSS) to high (VDD), although VDD is still applied to the gate of PMOS 511 a larger current will continue to flow through PMOS 511, as illustrated by the large arrow. As OUT is still low, PMOS 513 will still be on and NMOS 515 will not be sufficiently ON to take the node OUTn between PMOS 513 and NMOS 515 low, so that OUTn is high and the latch 513, 523 does not flip. Consequently, OUT stays low. One way to address this is to use larger area transistors, but this would require a large NMOS vs PMOS area multiplier, consuming significantly more of the valuable surface area of the die. To address this situation without resorting to such large transistors, the following presents embodiments for a current mirror latch level shifter.

Figure 6B:
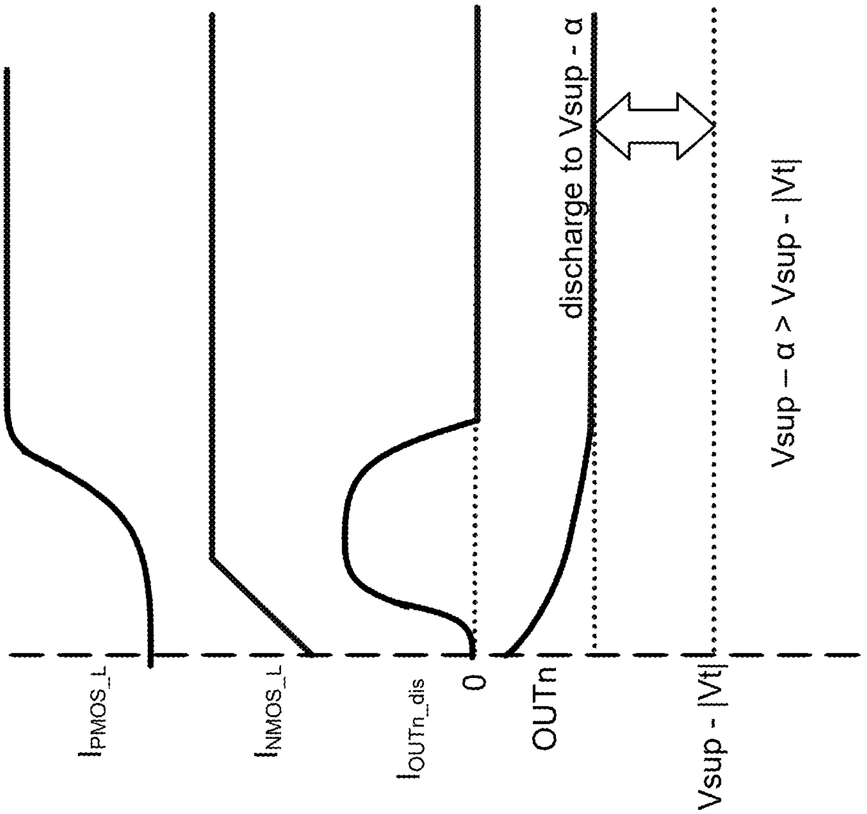
FIG. 6B shows the same set of waveforms as FIG. 5A, but in the situation of FIG. 6A when the level shifter circuit block is operated with too low a relative input level or too small NMOSs.

FIG. 6B shows the same set of waveforms as FIG. 5A, but in the situation of FIG. 6A when the level shifter circuit block is operated with too low a relative input level or too small NMOSs 515, 525. Similarly to in FIG. 5B, when IN goes high, $I_{NMOS\_L}$ ramps up, followed by then $I_{POUTn\_dis}$ to discharge OUTn, whose voltage level begins to drop. As OUTn begins to drop, then $I_{PMOS\_L}$ rises. However, the OUTn node only discharges to some amount α to the voltage level VSUP−α. If Vt is the threshold voltage of PMOS 523 and VSUP−α>VSUP−|Vt.., the gate of PMOS 523 is floating and PMOS 523 never triggers to turn on. This results in OUT staying low, so that PMOS 513 stays on and $I_{PMOS\_L}$ stays high, resulting in operational failure.

One approach to guarantee operation of the level shifter design of FIGS. 5A and 6A as the high IN value VDD decreases is to go to larger transistors for NMOSs 515 and 525 to increase current values. However, as the needed circuit area for such devices scales as $1/(VDD-Vt)^2$, as VDD goes lower the area for the NMOSs scale quadratically, with this area increasing asymptotically as VDD approaches their threshold voltage.

Going to lower VDD values has a number of advantages, including reduced logic circuit power consumption, increased input/output speeds, and logic circuit area scaling. For these reasons, non-volatile memory devices continue to move to lower VDD values. As discussed with respect to FIGS. 6A and 6B, though, the lower VDD levels also have the disadvantages of reduced level shifter circuit robustness, where level shifter operation must be guaranteed on all corners, which leads to increasing level shifter area, CMOS transistor device scaling considerations, and consideration of different circuit topologies. To address these concerns, embodiments are presented for a level shifter level shifter design using a switched current mirror design, as illustrated in FIG. 7.

Figure 7:
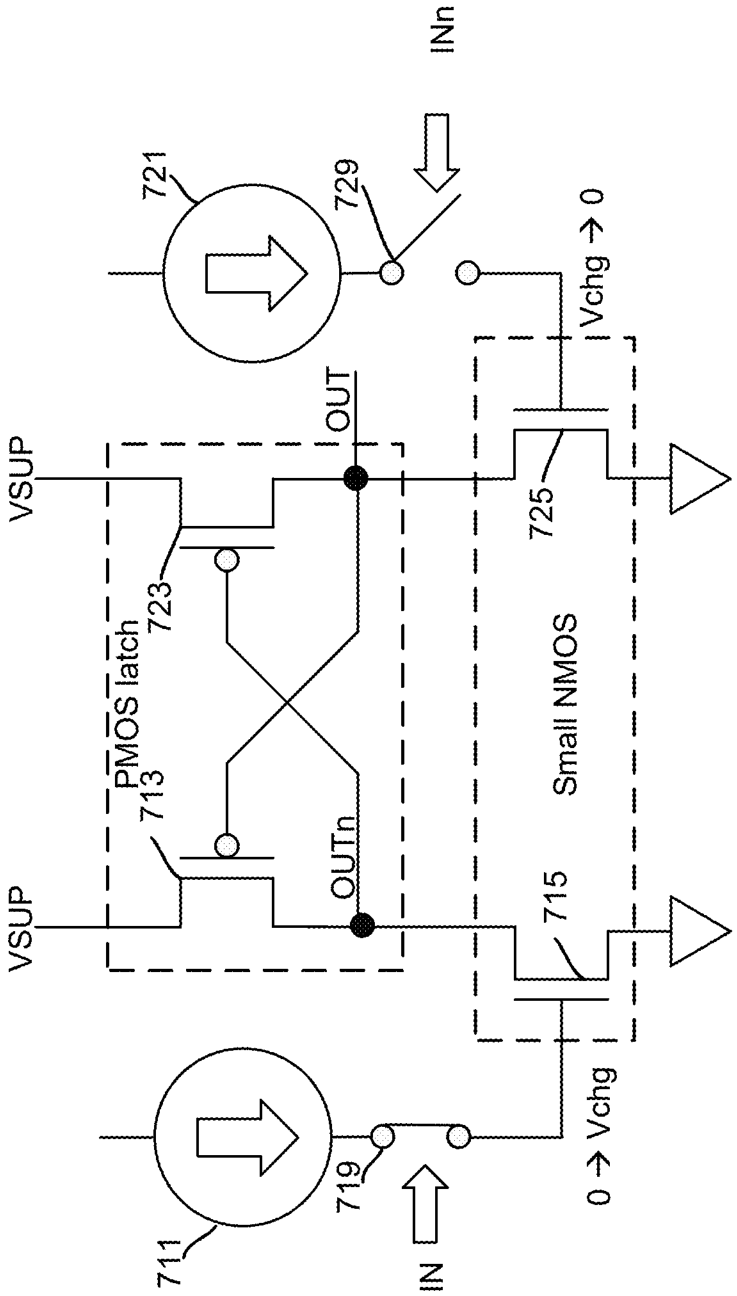
FIG. 7 presents an embodiment for a level shifter circuit with a switched current mirror suitable for low VDD operation.

FIG. 7 presents an embodiment for a level shifter circuit with a switched current mirror suitable for low VDD operation. Similar to FIGS. 5A and 6A, the level shifter again has two legs each connected in parallel between VSUP and ground. In the left leg, PMOS 713 is connected between VSUP and the OUTn node and NMOS 715 is connected between OUTn and ground. In the right leg, PMOS 723 is connected between VSUP and the OUT node and NMOS 725 is connected between OUT and ground. PMOS 713 and PMOS 723 are cross-coupled to form a latch, with the gate of PMOS 713 connected to OUT and the gate of PMOS 723 connected to OUTn. Relative to FIGS. 5A and 6A, the upper PMOSs 511 and 521 are not included.

The gates of the NMOSs 715 and 725 are now connected to respective current sources 711 and 721 through corresponding switches 719 and 729. The input IN is now used to control the switch 719 and its inverse INn controls switch 729. Under this arrangement, when IN goes from 0V to VDD and INn goes from VDD to 0V; the gate of NMOS 715 goes from 0V to a voltage level of Vchg and the gate of NMOS 725 goes from Vchg to 0V; and this results in NMOS 715 turning on (once the gate its charged enough) and taking OUTn to a low output and NMOS 725 turning off and OUT going to high output. When IN later goes low, the process is reversed between the left and right sides. The arrangement of FIG. 7 can use small NMOSs 715 and 725 since their gate voltages are large. The circuit's operation is guaranteed regardless of the VDD input level as long as the current sources 711, 721 can be activated and NMOS scaling is not needed even with lower VDD voltage levels.

Figure 8:
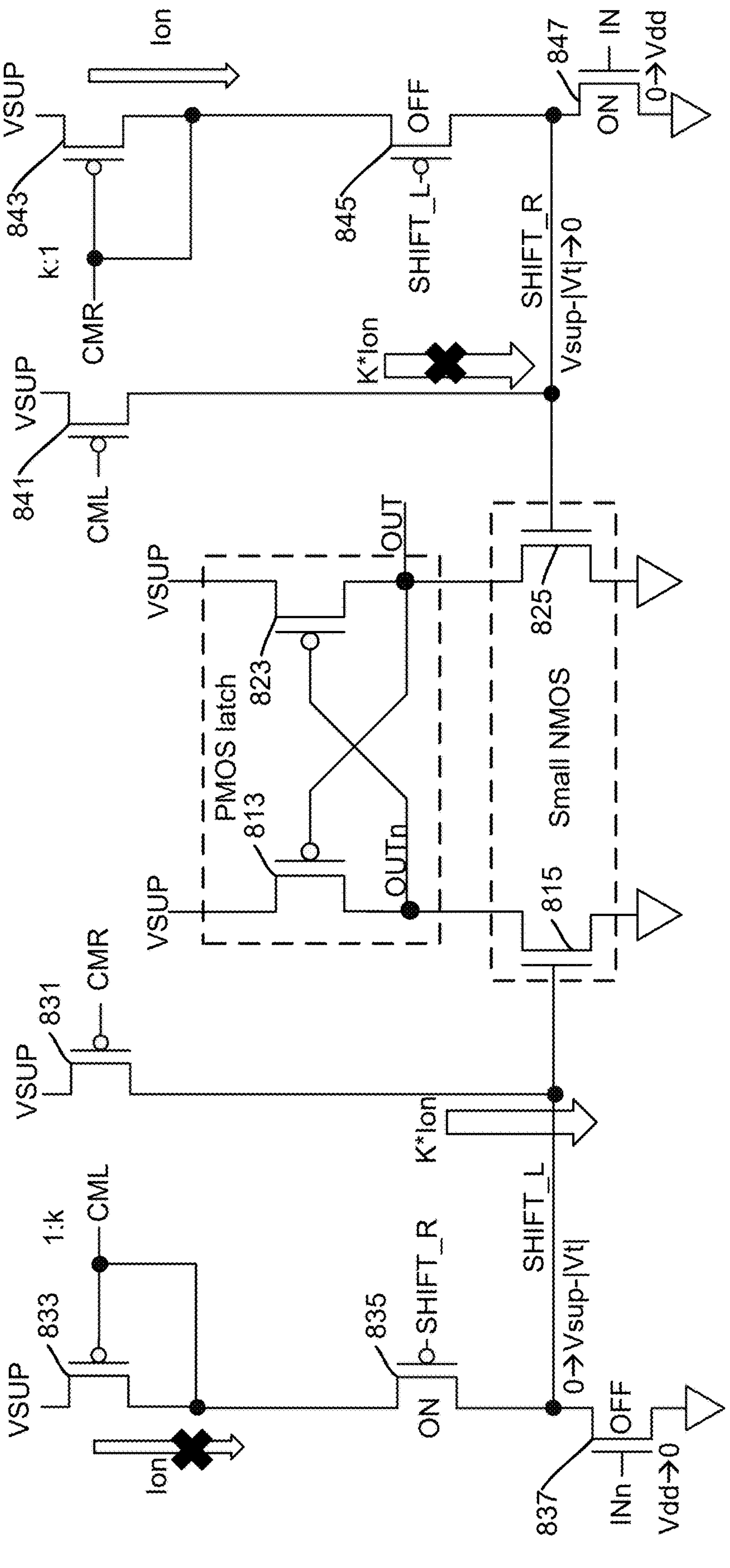
FIG. 8 is a more detailed implementation of the embodiment of FIG. 7.

FIG. 8 is a more detailed implementation of the embodiment of FIG. 7. At center, the two legs of the PMOSs 813, 823 forming the latch and small NMOSs 815, 825 are arranged as the similarly numbered corresponding elements of FIG. 7, but more detail is provided for an embodiment for the circuitry for the switches and current sources controlling the NMOSs 815, 825. On the left side as represented in the figure, the gate of NMOS 815 is connected to a node SHIFT_L that is also connected between PMOS 835 and, though NMOS 837, ground. On the right side, the gate of NMOS 825 is connected to a node SHIFT_R that is also connected between PMOS 845 and, though NMOS 847, ground. The gates of PMOS 835 and PMOS 845 are cross-coupled to the node SHIFT_R and SHIFT_L, respectively, of the other side. NMOSs 837 and 847 respectively have their gate connected to INn and IN, respectively.

PMOS 831 acts as a current source for SHIFT_L, being connected between VSUP and SHIFT_L and is connected in a current mirror arrangement to mirror the current in PMOS 843, which is connected between VSUP and PMOS 845. To effect this mirroring, the gates of PMOS 831 and PMOS 843 are both connected to the line CMR (current mirror right), that is also connected below PMOS 843 in a diode connect. The PMOS 831 and PMOS 843 can similarly sized in a 1:1 ratio for a 1 to 1 mirroring of the current in PMOS 843 in PMOS 831, or PMOS 831 can be sized larger in a k:1 ratio so that the current through PMOS 831 is k times that through PMOS 843. The larger the value of k, the more quickly SHIFT_L will charge up when PMOS 831 is on, but the more area that will be required, so that selection of the k value is a design choice. To provide a current source for SHIFT_R, PMOSs 841 and 833 are arranged, with the appropriate left to right changes, in a similar current mirror arrangement.

Considering the operation of the circuit of FIG. 8 before IN goes from low to high, initially before the transition IN will be at 0V and INn at VDD. This will mean that NMOS 837 is ON (note INn, not IN is applied to NMOS 837) and NMOS 847 is OFF. This puts SHIFT_L at 0V and SHIFT_R at VSUP−|Vt|, so that for PMOS 841, the gate is at VSUP−|Vt|, the drain at VSUP, and the source at VSUP−|Vt|. As PMOS 841 has pulled the node up before turning off at its steady state (turned off at steady state because SHIFT_R at VSUP−|Vt| is connected to the PMOS 835, which is then off). This sets NMOS 825 on and PMOS 835 off and NMOS 815 off and PMOS 845 on, putting OUT at 0V as the initial state before IN goes from low to high.

As INn transitions to 0V, NMOS 837 is now off, so that SHIFT_L can begin to rise, When IN transitions to VDD, NMOS 847 will turn on and SHIFT_R will go to low voltage around 0V (not exactly 0V in the beginning). This will activate current branch on the right side and Ion current flows through PMOS_843 and PMOS_845. This current is then mirrored by PMOS 831 by the multiplication factor k to pull up SHIFT_L node up. Furthermore, since SHIFT_R is low during this transition, current branch on the left side will also be activated and Ion_left current passes through PMOS_833 and PMOS_835 and help pull-up SHIFT_L further. As SHIFT_L goes higher to VSUP−|Vt| current mirror on the left and right branch are turned off (left: drain voltage is VSUP−|Vt|; right: cutoff by PMOS_845). Since both PMOS_841 and PMOS 845 are now OFF, SHIFT_R is pulled down to 0V completely by NMOS_847. At this point, NMOS 815 is on, OUTn goes low to turn on PMOS 823, raising OUT to VSUP and turning off PMOS 813.

Figure 9:
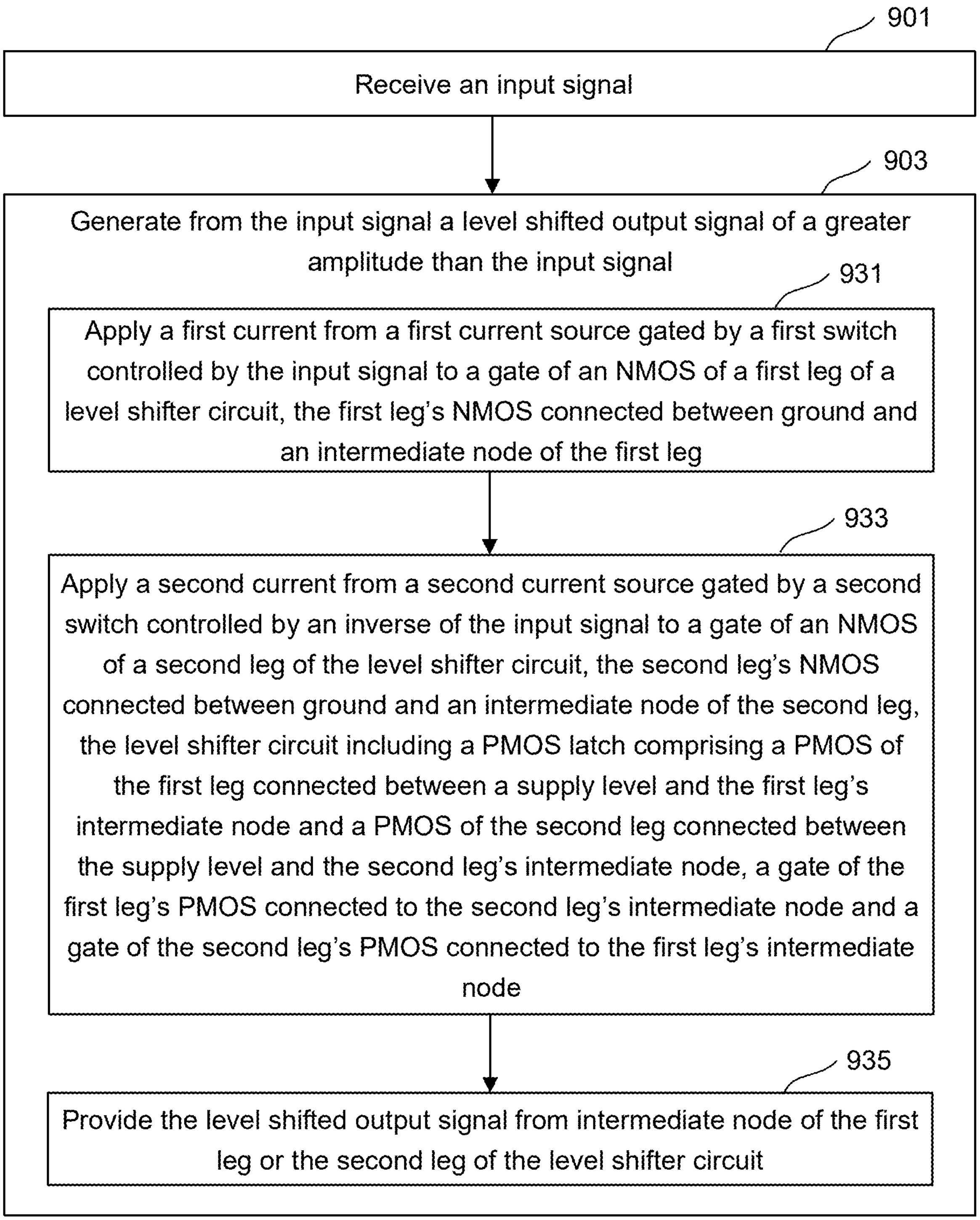
FIG. 9 is a flowchart of an embodiment of operating the level shifter circuit of FIGS. 7 and 8.

FIG. 9 is a flowchart for an embodiment of operating the level shifter circuit of FIGS. 7 and 8. Beginning with step 901, an input signal, such as a logic signal for control circuitry of a non-volatile memory system, is received. In step 903, a level shifted output signal of a greater amplitude than the input signal is generated from the input signal.

Considering step 903 in more detail, in step 931 a first current from a first current source gated by a first switch controlled by the input signal is applied to a gate of an NMOS of a first leg of a level shifter circuit, the first leg's NMOS connected between ground and an intermediate node of the first leg. Referring back to embodiment of FIG. 8, the first leg of the level shifter circuit can be PMOS 813 of the PMOS latch and NMOS transistor 815, where the first current is the current through PMOS 831 to the gate of NMOS 815. The first current source can include the current path through PMOS 831 connected in a current mirror arrangement with a second current path through diode connected PMOS 843, where the current mirror can be an unequal current mirror with a k:1 ratio based on the relative sizes of the PMOSs 813 and 843. The switch circuitry for the first leg can include NMOS 847 that receives the IN signal and also the PMOS 835.

In step 933 a second current from a second current source gated by a second switch controlled by an inverse of the input signal is applied to a gate of an NMOS of a second leg of the level shifter circuit. The second leg's NMOS is connected between ground and an intermediate node of the second leg (OUT), the level shifter circuit including a PMOS latch comprising a PMOS 813 of the first leg connected between a supply level and the first leg's intermediate node (OUTn) and a PMOS 823 of the second leg connected between the supply level and the second leg's intermediate node (OUT), a gate of the first leg's PMOS 813 connected to the second leg's intermediate node out and a gate of the second leg's PMOS 823 connected to the first leg's intermediate node (OUTn). The level shifted output can then be provided in step 935 from the OUT or OUTn node, depending on the embodiment.

In a first set of aspects, a level shifter circuit comprises: first and second legs connected in parallel between a supply voltage and ground, each leg comprising a PMOS connected between the supply voltage and an intermediate node and an NMOS connected between the intermediate node and ground, a gate of the first leg's PMOS connected to the intermediate node of the second leg and a gate of the second leg's PMOS connected to the intermediate node of the first leg, an output of the level shifter circuit provided from the second leg's intermediate node; first and second current sources; and first and second switches respectively configured to connect the first current source to the gate of the first leg's NMOS when an input signal is high and to connect the second current source to the gate of the second leg's NMOS when the input signal is low.

In other aspects, a method comprises receiving input signal and generating from the input signal a level shifted output signal of a greater amplitude than the input signal. Generating the level shifted output signal includes: applying a first current from a first current source gated by a first switch controlled by the input signal to a gate of an NMOS of a first leg of a level shifter circuit, the first leg's NMOS connected between ground and an intermediate node of the first leg; applying a second current from a second current source gated by a second switch controlled by an inverse of the input signal to a gate of an NMOS of a second leg of the level shifter circuit, the second leg's NMOS connected between ground and an intermediate node of the second leg, the level shifter circuit including a PMOS latch comprising a PMOS of the first leg connected between a supply level and the first leg's intermediate node and a PMOS of the second leg connected between the supply level and the second leg's intermediate node, a gate of the first leg's PMOS connected to the second leg's intermediate node and a gate of the second leg's PMOS connected to the first leg's intermediate node; and providing the level shifted output signal from intermediate node of the first leg or the second leg of the level shifter circuit.

In additional aspects, an apparatus comprises a control circuit configured to connect to an array of non-volatile memory cells and comprising a level shifter circuit configured to generate an output logic signal from an input logic signal, a high level of the output logic signal being higher than a high level of the input logic signal, the level shifter circuit configured to: receive the input logic signal; apply a first current from a first current source gated by a first switch controlled by the input logic signal to a gate of an NMOS of a first leg of a level shifter circuit, the first leg's NMOS connected between ground and an intermediate node of the first leg; apply a second current from a second current source gated by a second switch controlled by an inverse of the input logic signal to a gate of an NMOS of a second leg of the level shifter circuit, the second leg's NMOS connected between ground and an intermediate node of the second leg, the level shifter circuit including a PMOS latch comprising a PMOS of the first leg connected between a supply level and the first leg's intermediate node and a PMOS of the second leg connected between the supply level and the second leg's intermediate node, a gate of the first leg's PMOS connected to the second leg's intermediate node and a gate of the second leg's PMOS connected to the first leg's intermediate node; and provide the output logic signal from intermediate node of the first leg or the second leg of the level shifter circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A level shifter circuit, comprising first and second legs connected in parallel between a supply voltage and ground, each leg comprising a PMOS connected between the supply voltage and an intermediate node and an NMOS connected between the intermediate node and ground, a gate of the first leg's PMOS connected to the intermediate node of the second leg and a gate of the second leg's PMOS connected to the intermediate node of the first leg, an output of the level shifter circuit provided from the second leg's intermediate node;

first and second current sources; and first and second switches respectively configured to connect the first current source to the gate of the first leg's NMOS when an input signal is high and to connect the second current source to the gate of the second leg's NMOS when the input signal is low.

2. The level shifter circuit of claim 1, wherein:

the first current source includes a first PMOS connected between the supply voltage and a node connected to the gate of the NMOS of the first leg; and the second current source includes a first PMOS connected between the supply voltage and a node connected to the gate of the NMOS of the second leg.

3. The level shifter circuit of claim 2, wherein:

the first current source further includes a second PMOS connected between the supply voltage and the node connected to the gate of the NMOS of the second leg, the gates of the first and second PMOSs of a first current mirror commonly connected to a node between the second PMOS and the node connected to the gate of the NMOS of the second leg; and the second current source further includes a second PMOS connected between the supply voltage and the node connected to the gate of the NMOS of the first leg, the gates of the first and second PMOSs of a second current mirror commonly connected to a node between the second PMOS and the node connected to the gate of the NMOS of the first leg.

4. The level shifter circuit of claim 3, wherein:

in both of the first and second current sources, the first PMOS is sized in a ratio of k to 1 relative to the second PMOS, where k is greater than one.

5. The level shifter circuit of claim 3, wherein:

the first switch comprises:

a first switch NMOS connected between the node connected to the gate of the NMOS of the second leg and ground, the gate of first switch NMOS connected to receive the input signal; and a first switch PMOS connected between the node connected to the gate of the NMOS of the first leg and the node between the second PMOS of the second leg and the node connected to the gate of the NMOS of the first leg, the gate of the first switch PMOS connected to the node connected to the gate of the NMOS of the second leg; and the second switch comprises:

a second switch NMOS connected between the node connected to the gate of the NMOS of the first leg and ground, the gate of second switch NMOS connect to receive an inverse of the input signal; and a second switch PMOS connected between the node connected to the gate of the NMOS of the second leg and the node between the second PMOS and the node connected to the gate of the NMOS of the first leg, the gate of the second switch connected to the node connected to the gate of the NMOS of the first leg.

6. The level shifter circuit of claim 1, wherein the level shifter circuit is configured to generate from the input signal an output signal on the output of the level shifter circuit in response to an enable signal, an amplitude of the output signal being greater than an amplitude of the input signal.

7. The level shifter of claim 6, wherein the level shifter is part of a control circuit configured to connect to an array of non-volatile memory cells, the input signal being an input logic signal and the output signal being an input logic signal.

8. The level shifter of claim 7, wherein the control circuit is formed on a control die and the array of non-volatile memory cells formed on a memory die separate from and bonded to the control die.

9. A method, comprising:

receiving an input signal;

generating from the input signal a level shifted output signal of a greater amplitude than the input signal, including:

applying a first current from a first current source gated by a first switch controlled by the input signal to a gate of an NMOS of a first leg of a level shifter circuit, the first leg's NMOS connected between ground and an intermediate node of the first leg;

applying a second current from a second current source gated by a second switch controlled by an inverse of the input signal to a gate of an NMOS of a second leg of the level shifter circuit, the second leg's NMOS connected between ground and an intermediate node of the second leg, the level shifter circuit including a PMOS latch comprising a PMOS of the first leg connected between a supply level and the first leg's intermediate node and a PMOS of the second leg connected between the supply level and the second leg's intermediate node, a gate of the first leg's PMOS connected to the second leg's intermediate node and a gate of the second leg's PMOS connected to the first leg's intermediate node; and providing the level shifted output signal from the intermediate node of one of the first leg or the second leg of the level shifter circuit.

10. The method of claim 9, wherein the first current source is a first current mirror including a first current path providing the first current and a second current path mirrored by the first current path, and wherein the first switch gates the second current path to thereby gate the first current, and wherein the second current source is a second current mirror including a first current path providing the second current and a second current path mirrored by the first current path, and wherein the second switch gates the second current path to thereby gate the second current.

11. The method of claim 10, wherein each of the first and second current mirrors are unequal current mirrors, current though the first current being greater than current through the second current path.

12. The method of claim 10, wherein, for each of the first and second current mirrors, the corresponding first current path comprises a first PMOS connected between the supply level and the gate of the NMOS of the corresponding leg and the second current path comprises a diode connected PMOS connected between the supply level and ground.

13. The method of claim 12, wherein:

the first switch includes a first switch NMOS connected between the gate of the NMOS of the second leg and ground and a first switch PMOS connected between the diode connected PMOS of the second current mirror and the gate of the NMOS of the first leg, and wherein applying the first current gated by the first switch to the gate of the NMOS of the first leg of the level shifter circuit comprises applying the input signal to gate of the first switch NMOS; and the second switch includes a second switch NMOS connected between the gate of the NMOS of the first leg and ground and a second switch PMOS connected between the diode connected PMOS of the first current mirror and the gate of the NMOS of the second leg, and wherein applying the second current gated by the second switch to the gate of the NMOS of the second leg of the level shifter circuit comprises applying the inverse of the input signal to gate of the second switch NMOS.

14. The method of claim 9, wherein the input signal is a logic signal and the output signal is a level shifted logic signal.

15. An apparatus, comprising:

a control circuit configured to connect to an array of non-volatile memory cells and comprising a level shifter circuit configured to generate an output logic signal from an input logic signal, a high level of the output logic signal being higher than a high level of the input logic signal, the level shifter circuit configured to:

receive the input logic signal;

apply a first current from a first current source gated by a first switch controlled by the input logic signal to a gate of an NMOS of a first leg of a level shifter circuit, the first leg's NMOS connected between ground and an intermediate node of the first leg;

apply a second current from a second current source gated by a second switch controlled by an inverse of the input logic signal to a gate of an NMOS of a second leg of the level shifter circuit, the second leg's NMOS connected between ground and an intermediate node of the second leg, the level shifter circuit including a PMOS latch comprising a PMOS of the first leg connected between a supply level and the first leg's intermediate node and a PMOS of the second leg connected between the supply level and the second leg's intermediate node, a gate of the first leg's PMOS connected to the second leg's intermediate node and a gate of the second leg's PMOS connected to the first leg's intermediate node; and provide the output logic signal from the intermediate node of one of the first leg or the second leg of the level shifter circuit.

16. The apparatus of claim 15, wherein the control circuit is formed on a control die, the apparatus further comprising:

a memory die including the array of memory cells, the memory die separate from and bonded to the control die.

17. The apparatus of claim 15, wherein the high logic level of the output logic signal is the supply level.

18. The apparatus of claim 15, wherein the control circuit includes system control logic circuitry having logic circuitry that operates using the high level of the input logic signal, and decoding circuitry for the array of non-volatile memory cells having logic circuitry that operates using the high level of the output logic signal.

19. The apparatus of claim 15, wherein the first current source is a first current mirror including a first current path providing the first current and a second current path mirrored by the first current path, and wherein the first switch gates the second current path to thereby gate the first current, and wherein the second current source is a second current mirror including a first current path providing the second current and a second current path mirrored by the first current path, and wherein the second switch gates the second current path to thereby gate the second current.

20. The apparatus of claim 19, wherein each of the first and second current mirrors are unequal current mirrors, current though the first current being greater than current through the second current path.

* * * * *